(12) United States Patent
Stewart et al.

(10) Patent No.: US 10,388,646 B1
(45) Date of Patent: Aug. 20, 2019

(54) ELECTROSTATIC DISCHARGE PROTECTION DEVICES INCLUDING A FIELD-INDUCED SWITCHING ELEMENT

(71) Applicant: SANDISK TECHNOLOGIES LLC, Addison, TX (US)

(72) Inventors: Derek Stewart, Livermore, CA (US); Daniel Bedau, San Jose, CA (US); Michael Grobis, Campbell, CA (US); Christopher J. Petti, Mountain View, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/996,738

(22) Filed: Jun. 4, 2018

(51) Int. Cl.
*H01L 27/02* (2006.01)
*H02H 9/04* (2006.01)
*H01L 27/24* (2006.01)
*H01L 23/00* (2006.01)
*H01L 49/00* (2006.01)
*H01L 45/00* (2006.01)

(52) U.S. Cl.
CPC .......... *H01L 27/0248* (2013.01); *H01L 24/06* (2013.01); *H01L 27/0288* (2013.01); *H01L 27/0292* (2013.01); *H01L 27/0296* (2013.01); *H01L 27/2436* (2013.01); *H01L 49/003* (2013.01); *H02H 9/046* (2013.01); *H01L 45/06* (2013.01); *H01L 45/08* (2013.01); *H01L 45/143* (2013.01); *H01L 45/144* (2013.01); *H01L 45/146* (2013.01); *H01L 2224/0401* (2013.01); *H01L 2224/0603* (2013.01); *H01L 2224/06051* (2013.01)

(58) Field of Classification Search
None
See application file for complete search history.

(56) References Cited

U.S. PATENT DOCUMENTS

| | | | |
|---|---|---|---|
| 4,860,155 | A | 8/1989 | Wright |
| 4,977,357 | A | 12/1990 | Shrier |
| 5,045,355 | A | 9/1991 | Spiro et al. |
| 5,068,634 | A | 11/1991 | Shrier |
| 5,099,380 | A | 3/1992 | Childers et al. |

(Continued)

FOREIGN PATENT DOCUMENTS

| | | |
|---|---|---|
| CN | 102923676 A | 2/2013 |
| EP | 0198624 A1 | 10/1986 |

(Continued)

OTHER PUBLICATIONS

Janod, Etienne, et al. "Resistive Switching in Mott Insulators and Correlated Systems." Advanced Functional Materials, vol. 25, No. 40, 2015, pp. 6287-6305., doi:10.1002/adfm.201500823. (Year: 2015).*

(Continued)

*Primary Examiner* — J. E. Schoenholtz
(74) *Attorney, Agent, or Firm* — The Marbury Law Group PLLC

(57) ABSTRACT

A surge protection device contains a first electrode, a second electrode electrically connected to electrical ground, and a field-induced switching component electrically contacting the first electrode and the second electrode. The field-induced switching component can include a correlated-electron material or a volatile conductive bridge.

4 Claims, 11 Drawing Sheets

(56) References Cited

U.S. PATENT DOCUMENTS

| | | | |
|---|---|---|---|
| 5,142,263 | A | 8/1992 | Childers et al. |
| 5,152,930 | A | 10/1992 | Spiro et al. |
| 5,189,387 | A | 2/1993 | Childers et al. |
| 5,248,517 | A | 9/1993 | Childers et al. |
| 5,807,509 | A | 9/1998 | Shrier et al. |
| 7,173,311 | B2 | 2/2007 | Sato et al. |
| 7,764,477 | B2 * | 7/2010 | Tang .................... H01L 27/0251 361/118 |
| 9,053,844 | B2 | 6/2015 | Kosowsky et al. |
| 9,713,254 | B2 | 7/2017 | Young et al. |
| 9,972,687 | B1 * | 5/2018 | Eom |
| 10,141,298 | B2 * | 11/2018 | Hong .................... H01L 27/0288 |
| 10,224,099 | B1 * | 3/2019 | Eyole .................... G11C 13/004 |
| 2003/0173669 | A1 * | 9/2003 | Shau .................... H01L 21/8221 257/758 |
| 2005/0082619 | A1 | 4/2005 | Wu et al. |
| 2006/0011942 | A1 * | 1/2006 | Kim .................... H01L 45/04 257/192 |
| 2007/0045743 | A1 | 3/2007 | Tseng |
| 2009/0244796 | A1 * | 10/2009 | Tang .................... H01L 27/0251 361/56 |
| 2016/0028227 | A1 * | 1/2016 | Suzuki .................... H01T 1/22 361/56 |
| 2016/0268248 | A1 * | 9/2016 | Fan .................... H01L 27/0255 |
| 2016/0293521 | A1 * | 10/2016 | Chen .................... H01L 23/49503 |
| 2017/0170166 | A1 * | 6/2017 | Song .................... H01L 27/0255 |
| 2017/0179385 | A1 * | 6/2017 | Shifren .................... H01L 27/0808 |
| 2018/0026026 | A1 * | 1/2018 | Hong .................... H01L 27/0288 257/4 |
| 2019/0088871 | A1 * | 3/2019 | Kim .................... H01L 45/1233 |
| 2019/0097419 | A1 * | 3/2019 | Pelella .................... H02H 9/046 |

FOREIGN PATENT DOCUMENTS

| | | |
|---|---|---|
| JP | 2004-006433 A | 1/2004 |
| WO | WO1996002924 A1 | 2/1996 |
| WO | WO1997026665 A1 | 7/1997 |
| WO | 2001024237 A1 | 4/2001 |
| WO | WO-2019005159 A1 * | 1/2019 |

OTHER PUBLICATIONS

Brito, W. H., et al. "Dynamic Electronic Correlation Effects in NbO2 as Compared to VO2." Physical Review B, vol. 96, No. 19, 2017, doi:10.1103/physrevb.96.195102. (Year: 2017).*

G. Navarro et al, "Innovative PCM+OTS device with high sub-threshold non-linearity for non-switching reading operations and higher endurance performance," Proceedings of Symposium on VLSI Technology, 2017, DOI:10.23919/VLSIT.2017.7998208, Jun. 5-8, 2017, Kyoto, Japan.

Y. Koo et al, "Te-based amorphous binary OTS device with excellent selector characteristics for x-point memory applications," Proceedings of Symposium on VLSI Technology, 2016 DOI:10.1109/VLSIT.2016.7573389, Jun. 14-16, 2016 Honolulu, HI.

Janod, Etienne, et al., "Resistive Switching in Mott Insulators and Correlated Systems," *Adv. Funct. Mat.*,25, 6287 (2015).

Kevin Knapp, Proper Planning Assures SOC Power Integrity, Electronics Systems Design Engineering, Published Jan. 31, 2007 at http://chipdesignmag.com/display.php?articleId=966.

International Application No. PCT/US2019/017073, International Search Report and Written Opinion, dated May 29, 2019, 11pgs.

* cited by examiner

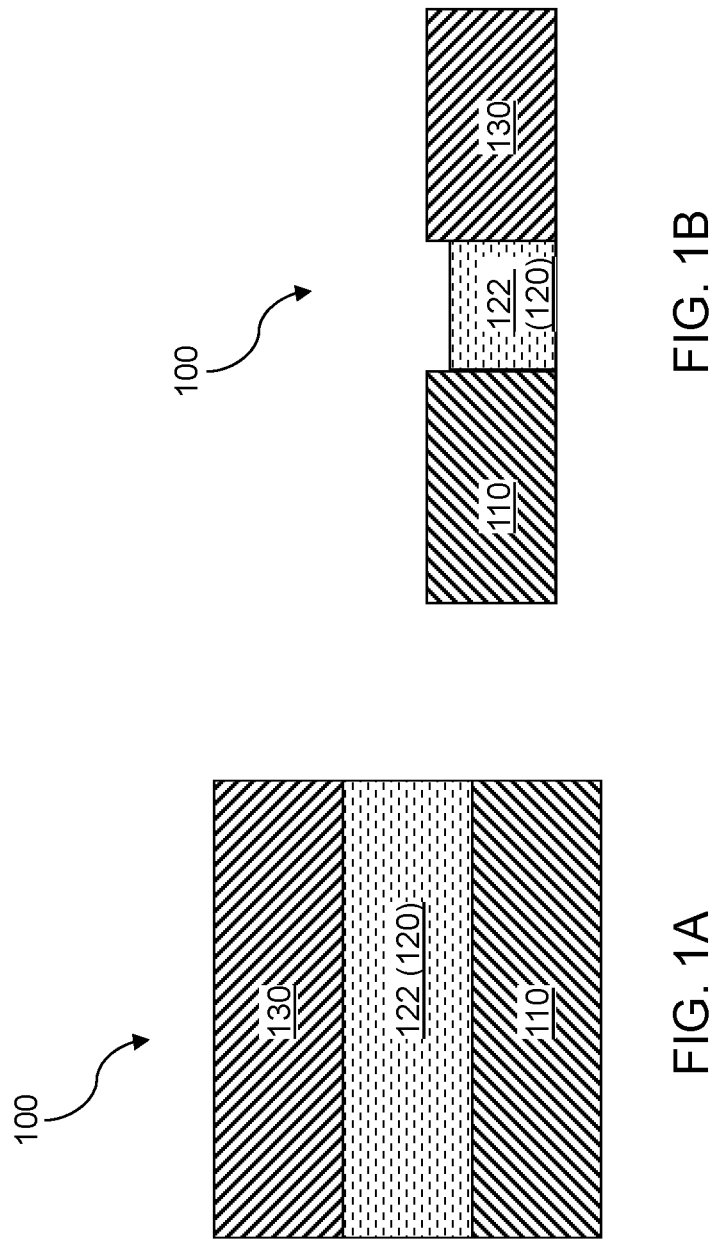

ELECTROSTATIC DISCHARGE PROTECTION DEVICES INCLUDING A FIELD-INDUCED SWITCHING ELEMENT

FIELD

The present disclosure generally relates to semiconductor devices, and particularly to electrostatic discharge protection devices including a field-induced switching element and methods of manufacturing the same.

BACKGROUND

Operation of device components within specified current and voltage specification ranges ensures high endurance, long life, and optimal performance of electronic devices. Transient surge currents or large voltage spikes across an electronic system can lead to circuit burnout and/or partial or complete failure of the electronic system. Such transients can be caused by electrostatic discharge (ESD), natural causes (such as lightning strikes or solar flares), or load switching in power circuits.

SUMMARY

According to an aspect of the present disclosure, a device structure includes a semiconductor device located over a substrate, a first electrode located within, or over, interconnect-level dielectric layers that overlie the semiconductor device and electrically shorted to a node of the semiconductor device, a field-induced switching component exhibiting formation of a volatile electrical-field-induced temporary electrically conductive path upon application of an electrical field thereacross above a critical electrical field strength and having a first surface that contacts the first electrode, and a second electrode located within, or over, the interconnect-level dielectric layers, contacting a second surface of the field-induced switching component, and electrically connected to electrical ground.

According to an aspect of the present disclosure, a surge protection device comprises a first electrode, a second electrode electrically connected to electrical ground, and a field-induced switching component electrically contacting the first electrode and the second electrode, wherein the field-induced switching component comprises a correlated-electron material or a volatile conductive bridge.

BRIEF DESCRIPTION OF THE DRAWINGS

FIG. 1A is a vertical cross-sectional view of a first configuration of an exemplary electrostatic discharge device according to an embodiment of the present disclosure.

FIG. 1B is a vertical cross-sectional view of a second configuration of an exemplary electrostatic discharge device according to an embodiment of the present disclosure.

DETAILED DESCRIPTION

Figure 3:
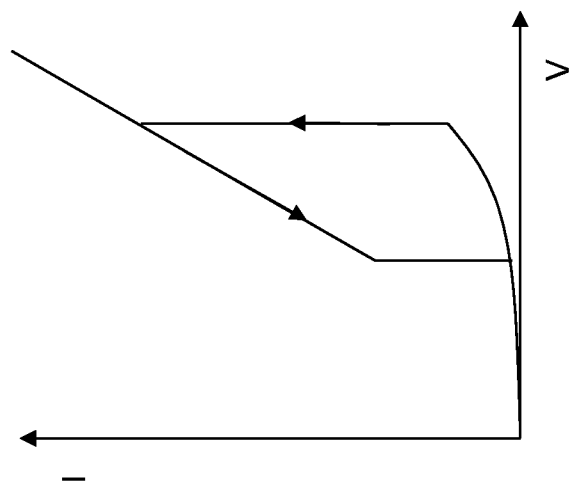
FIG. 3 is a schematic voltage-current characteristic of a metal-insulator transition material composed of correlated electron material or Group IV-chalcogenide compound within devices of the embodiments of the present disclosure, in which the current is limited by a series resistor.

A surge protector can prevent premature failure of electronic systems by providing current discharge paths under transient conditions. With growth of personal mobile electronic devices and sensors, on-chip protection against electrical transients is desired at the packaging level and at the individual device level. As discussed above, the embodiments of the present disclosure are directed to electrostatic discharge protection devices including a field-induced switching element and methods of manufacturing the same, the various aspects of which are discussed in detail here below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "layer" refers to a material portion including a region having a thickness. A layer may extend over the entirety of an underlying or overlying structure, or may have an extent less than the extent of an underlying or overlying structure.

Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, and/or may have one or more layer thereupon, there above, and/or there below.

As used herein, a "semiconducting material" refers to a material having electrical conductivity in the range from $1.0 \times 10^{-6}$ S/cm to $1.0 \times 10^{2}$ S/cm. As used herein, a "semiconductor material" refers to a material having electrical conductivity in the range from $1.0 \times 10^{-6}$ S/cm to $1.0 \times 10^{2}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{2}$ S/cm. As used herein, an "insulating material" or a "dielectric material" refers to a material having electrical conductivity less than $1.0 \times 10^{-2}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{2}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. Thus, a metallic material includes at least one metal element and may optionally include one or more non-metal elements provided that the metallic material is conductive. Examples of a non-metal element within the metallic material include nitrogen or silicon, which form a conductive metal nitride, such as TiN, TaN, and WN, or a conductive metal silicide, such as tungsten silicon, titanium silicide, nickel silicide, tantalum silicide, etc. The electrical conductivities values discussed here are those assumed under nominal device operation conditions.

According to an aspect of the present disclosure, electrostatic discharge (ESD) protection devices employing a field-induced switching component is disclosed, which can be incorporated into an integrated semiconductor circuit or formed as discrete device components within a chip package. The ESD devices of the embodiments of the present disclosure can mitigate the effects of current and voltage surges due to ESD events, and thus, protect the semiconductor circuitry to which the ESD devices are electrically connected.

Referring to FIGS. 1A and 1B, configurations of exemplary electrostatic discharge (ESD) devices according to embodiments of the present disclosure include a field-induced switching component 120 that is provided between a first electrode and a second electrode. The first electrode 110 and the second electrode 130 can comprise any suitable electrically conductive material, such as a metallic material (e.g., metal, metal alloy, conductive metal nitride, conductive metal silicide, etc.) or a heavily doped semiconductor. The field-induced switching component 120 includes a first surface that contacts the first electrode 110 and a second surface that contact the second electrode 130. The first surface and the second surface can be horizontal surfaces as in the first configuration of the exemplary ESD device 100 of FIG. 1A, or can be vertical surfaces as in the second configuration of the exemplary ESD device 100 of FIG. 1B. Alternatively, the first surface and/or the second surface may include a tapered surface and/or a combination of multiple surfaces that includes at least one horizontal surface and/or at least one vertical surface. The first electrode 110 and the second electrode 130 can be components of metallic interconnect structures embedded within at least one dielectric material layer (not shown) above a semiconductor substrate including semiconductor devices, or can be located on a chip package and/or above a semiconductor chip.

According to one embodiment of the present disclosure, the field-induced switching component 120 can comprise, and/or can consist of, a metal-insulator transition material portion 122 exhibiting an electrical-field-induced metal-insulator transition. In this case, the ESD device 100 of the embodiments of the present disclosure is referred to as a metal-insulator transition-based ESD device 100. A "metal-insulator transition material" or a "metal-insulating transition material" refers to a material that undergoes a metal-insulator transition under suitable external conditions such as an electric field, temperature, pressure, or atomic concentration of a dopant. A "metal-insulator transition," which is also referred to as a "conductor-insulator" transition, is a transition from an electrically "conductive material" to an electrically "insulating material" or from an electrically "insulating material" to an electrically "conductive material." In some embodiments of the present disclosure, the metal-insulator transition material is a volatile material which transitions from an electrically insulating material to an electrically conductive material upon application of a voltage larger than a threshold voltage across the material, which transitions back from the electrically conductive material to the electrically insulating material upon termination of application of such voltage across the material. Such materials include correlated-electron materials, Ovonic Threshold Switching (OTS) chalcogenide materials, and volatile conductive bridge materials which will be described in more detail below.

According to the band structure model of solid state physics, the Fermi level is located within a band gap for insulators and in the conduction band for metals. Thus, the band structure model predicts that a material with partially filled energy bands should display metallic behavior. However, some compounds predicted to have partially filled energy bands actually display insulating behavior. There have been many theories developed to explain this phenomenon. In general terms, this insulating behavior is due to strong electron-electron correlation or Coulomb interactions between electrons that prevents independent movement of individual electrons and can lead to electron localization. This can lead to a large Coulomb repulsion or energy barrier for an electron to hop from an energy level on one atomic site to an energy level at a neighboring atomic site that already has another electron. Several transition metal oxides have strongly correlated electrons in partially filled narrow d or f orbitals and this leads to insulating behavior. Within metal-insulator transition materials, external parameters such as applied electrical field, temperature, or pressure can alter the electron-electron correlation, thereby causing the metal-insulator transition.

Typically, a material displaying electron-electron correlation, or a "correlated electron material," has incompletely filled d- or f-electron shells with narrow energy bands. In this case, an electron in the correlated electron material cannot be viewed as being present in a "sea" of the averaged motion of the other electrons as presumed in the mean field theory. Each electron has a complex influence on other electrons, and thus, effective one-electron theories such density functional theory fail to adequately describe the behavior of the correlated electron materials. For instance, nickel oxide (NiO) has a partially filled 3d-band, and thus, is expected to be a good conductor under the Hartree-Fock theory. However, strong Coulomb repulsion (a correlation effect) between d-electrons makes NiO a wide-band gap insulator in the absence of an applied electrical field.

In case a metal-insulator transition material exhibits a metal-insulator transition induced by external electrical field, the magnitude of the electrical field that triggers the metal-insulator transition (i.e., the critical electrical field) is dependent on the band gap structure of the metal-insulator transition material. By selecting the species of the metal-insulator transition material and the geometrical dimensions (such as the thickness) of the metal-insulator transition material, ESD devices 100 that provide an electrically conductive path above a critical voltage bias can be formed.

Figure 2:
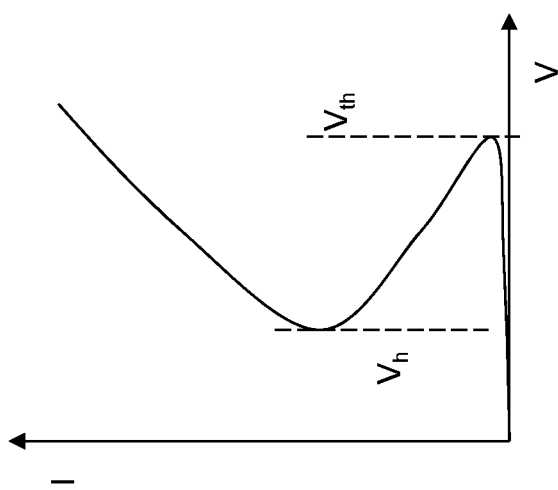
FIG. 2 is a schematic voltage-current characteristic of a metal-insulator transition material composed of a correlated electron material or Group IV-chalcogenide compound within devices of the embodiments of the present disclosure.

In one embodiment, the metal-insulator transition material portion 122 exhibiting an electrical-field-induced metal-insulator transition can include a correlated-electron metal oxide, which is a metal oxide that exhibits the behavior of electron-electron correlation. An exemplary current-voltage (IV) characteristic curve for a correlated-electron metal oxide is shown in FIG. 2. In a correlated-electron metal oxide, electrons are strongly localized on individual atoms with high Coulomb repulsion energy barriers that prevent hopping of electrons from one site to another. For example, the presence of highly localized d or f orbitals in the correlated-electron metal oxides leads to an insulating (high resistance) ground state at room temperature.

The insulating state can be switched temporarily to a conductive state through the application of a sufficiently large electric field. Under a sufficiently large voltage, which is herein referred to as a threshold voltage ($V_{th}$), the Coulomb repulsion energy barriers are sufficiently lowered to allow hopping of electrons and flow of electrical current. The applied electric field effectively lowers the barrier for electron hopping between atomic sites, and can result in a sizable current flow.

If the applied bias voltage is lowered below a lower limit for allowing hopping of electrons, which is herein referred to as a hold voltage ($V_h$), the correlated-electron metal oxide reverts to an insulating state. When the external electrical field is removed, the correlated-electron metal oxide material reverts back to its insulating state. Electrical-field-induced phase transitions in the correlated-electron metal oxide material can be repeated numerous times without noticeable effects on the property of the correlated-electron metal oxide material.

In one embodiment, the metal-insulator transition material portion 122 comprises, and/or consists of, a transition metal oxide. In one embodiment, the metal-insulator transition material portion 122 comprises, and/or consists essentially of, a correlated electron material composed of a transition metal chalcogenide. In one embodiment, the metal-insulator transition material portion 122 comprises, and/or consists of, at least one material selected from niobium dioxide, chromium-doped vanadium (III) oxide ($V_2O_3$), vanadium dioxide ($VO_2$), and nickel oxide (NiO).

In one embodiment, the metal-insulator transition material portion 122 exhibiting an electrical-field-induced metal-insulator transition can include a correlated electron material composed of a transition metal chalcogenide. In one embodiment, the metal-insulator transition material portion 122 comprises, and/or consists of, an $AM_4Q_8$-type metal-insulator transition material in which A is selected from Ga and Ge, M is selected from V, Nb, and Ta, and Q is selected from S and Se. The $AM_4Q_8$-type metal-insulator transition material has a lacunar spinel crystal structure, and displays an electrical-field-induced metal-insulator transition above a critical threshold voltage (e.g., above a threshold electrical field strength).

In one embodiment, the metal-insulator transition material portion 122 exhibiting an electrical-field-induced metal-insulator transition can include an OTS chalcogenide material composed of a Group IV-chalcogenide. As used herein, a "Group IV-chalcogenide" refers to a compound including at least one Group IV element and at least one chalcogenide element. Group IV elements include carbon, silicon, germanium, tin, and lead. The "Group IV-chalcogenide" can be undoped or can also include dopants from the Group V elements, such as N, P, As, or Sb. FIG. 3 illustrates an exemplary current-voltage characteristic of a metal-insulator transition material composed of a Group IV-chalcogenide compound within devices of the embodiments of the present disclosure. The device may also include a current limited series resistor which limits the current through the device. Group IV-chalcogenide compounds displaying volatile field-induced switching behaviors can provide a ratio on the order of, or greater than, $1.0 \times 10^5$ between an on-current and an off-current. Field-induced switching behaviors refer to the property of exhibiting formation of an electrical-field-induced temporary electrically conductive path upon application of an electrical field thereacross above the threshold voltage and dissipation of the electrically conductive path upon termination of such voltage.

In one embodiment, the metal-insulator transition material portion 122 comprises a Group IV-chalcogenide OTS compound comprising at least one of Si and Ge and at least one of Se and Te. In one embodiment, the metal-insulator transition material portion 122 has a composition of $L_xM_{1-x}$, wherein L is selected from Si and Ge, M is selected from Se and Te, and x is in a range 0.25 to 0.75. For example, the metal-insulator transition material portion 122 can include a material such as $Si_xTe_{1-x}$ or $Ge_xSe_{1-x}$. In a further embodiment the $L_xM_{1-x}$ material is doped with a Group V element.

Figure 4B:
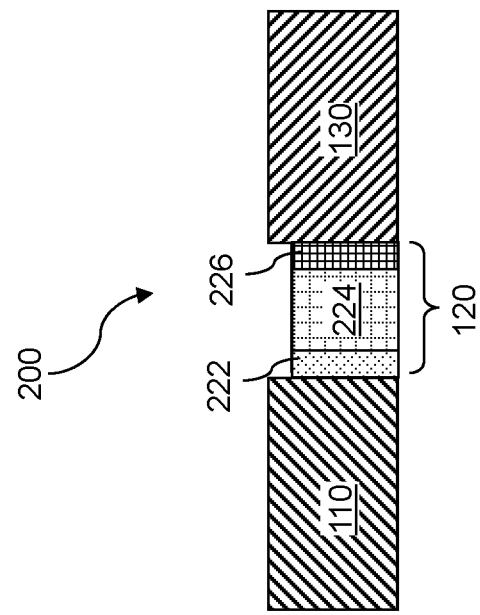
FIG. 4B is a vertical cross-sectional view of a fourth configuration of an exemplary electrostatic discharge device according to an embodiment of the embodiments of the present disclosure.
Figure 4A:
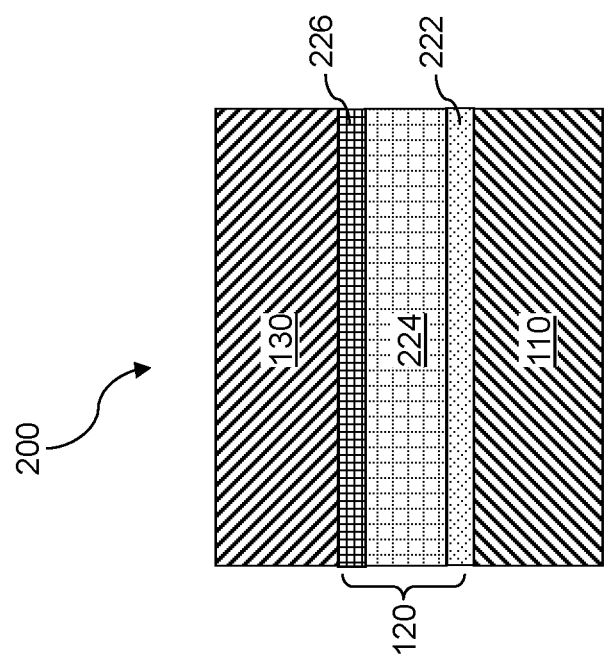
FIG. 4A is a vertical cross-sectional view of a third configuration of an exemplary electrostatic discharge device according to an embodiment of the embodiments of the present disclosure.

Referring to FIGS. 4A and 4B, configurations of exemplary electrostatic discharge (ESD) devices according to embodiments of the present disclosure include a volatile conductive bridge field-induced switching component 120 that is provided between a first electrode 110 and a second electrode 130. Each of the first electrode 110 and the second electrode 130 includes a conductive material such as a metallic material or a heavily doped semiconductor material. The field-induced switching component 120 includes a first surface that contacts the first electrode 110 and a second surface that contact the second electrode 130. The first surface and the second surface can be horizontal surfaces as in the first configuration of the exemplary ESD device 200 of FIG. 4A, or can be vertical surfaces as in the second configuration of the exemplary ESD device 200 of FIG. 4B. Alternatively, the first surface and/or the second surface may include a tapered surface and/or a combination of multiple surfaces that includes at least one horizontal surface and/or at least one vertical surface. The first electrode 110 and the second electrode 130 can be components of metal interconnect structures embedded within at least one dielectric material layer (not shown) above a semiconductor substrate including semiconductor devices, or can be located on a chip package or above a semiconductor chip.

According to one embodiment of the present disclosure, the volatile conductive bridge field-induced switching component 120 can comprise, and/or can consist of, a volatile mobile ion bridge structure (222, 224, 226) exhibiting formation of an electrical-field-induced temporary electrically conductive path upon application of an electrical field thereacross above a critical electrical field strength. In this case, the ESD device 200 of the embodiments of the present disclosure is referred to as a mobile-ion-bridge-based ESD device 200. As used herein, a "mobile ion bridge structure" refers to a structure configured to build a temporary electrically conductive path therethrough upon application of an electrical bias thereacross by movement of ions into an insulating region. The temporary electrically conductive path disappears by diffusion of the ions away from the insulating region once the electrical bias is discontinued. In one embodiment, the ions can be metal ions that are provided from a metal portion located on one side of the insulating region upon application of the electrical field, and drift back toward the metal portion upon removal of the electrical field.

In one embodiment, the mobile ion bridge structure (222, 224, 226) can comprise, and/or consist of, a first metal layer 222; a dielectric metal oxide layer 224 located on the first metal layer 222, and a second metal layer 226 contacting the dielectric metal oxide layer 224 and spaced from the first metal layer 222. The first metal layer 222 is composed of a first metal that provides mobile ions into the dielectric metal oxide layer 224 upon application of an external electrical bias. The dielectric metal oxide layer 224 functions as a matrix for the mobile ions that are injected from the first metal layer 222. Under a sufficient applied voltage, the mobile ions form a conductive path in the dielectric metal oxide layer. Upon termination of the electrical bias voltage, the conductive path dissociates and the mobile ions generated from the first metal layer 222 drift to the first metal layer 222 or the second metal layer 226. The first metal layer 222 contacts one of the first electrode 110 and the second electrode 130, and the second metal layer 226 contacts another of the first electrode 110 and the second electrode 130.

In one embodiment, the first metal layer 222 and the second metal layer 226 comprises, and/or consists of, a silver layer, the dielectric metal oxide layer 224 comprises, and/or consists of, hafnium oxide, and another of the first metal layer 222 and the third metal layer 226 comprises, and/or consists of, a metal (e.g., Ag, Al, W, Cu, etc.), a metal alloy (e.g., metal silicide or conductive metal nitride) or a conductive semiconductor material (i.e., a heavily doped semiconductor material, such as polysilicon, having a conductivity greater than $1.0 \times 10^5$ S/cm.

Various embodiments of the ESD devices (100, 200) described above can be incorporated inside a semiconductor chip as an on-chip ESD device, or onto a semiconductor chip as a surface mounted ESD device. The incorporated ESD devices (100, 200) can be employed to prevent damage from electrostatic discharge, load switching, and/or lightning strikes. The first electrode 110 and/or the second electrode 130 can be, or can directly contact, end portions of a respective conductive lead such as a metal interconnect structure. The dimensions (such as the thickness) of the field-induced switching component 120 can be selected to provide a target ESD threshold voltage above which the field-induced switching component 120 provides a conductive path, which dissipates (i.e., disappears) once the application of the voltage is terminated. Optionally, additional layers (such as passivation layers) can be provided to prevent ionic diffusion between the metallic components and insulating components within, or around, the ESD device. Further, additional components may be optionally formed to accommodate height differences in case the various components of the ESD device (100, 200) are formed at different levels. One end of the ESD device (100, 200), i.e., one of the first electrode 110 and the second electrode 130, is connected to an active component of an integrated circuit to be protected, and another end of the ESD device (100, 200), i.e., another of the first electrode 110 and the second electrode 130, is connected to electrical ground, which can be, for example, a semiconductor substrate of a semiconductor chip and/or a ground pin of a chip package.

In some embodiment, one of more of the ESD devices (100, 200) of the embodiments of the present disclosure can be incorporated into, or onto, a semiconductor structure including semiconductor devices and metal interconnect structures. FIGS. 5-9 illustrate first, second, third, fourth, and fifth exemplary semiconductor structures, respectively, according to embodiments of the present disclosure. Each of the exemplary semiconductor structures of FIGS. 5-9 can comprise a semiconductor chip 900.

Each semiconductor chip 900 includes a substrate 8. The substrate 8 includes a substrate semiconductor layer 4, which can be a diced portion of a commercially available silicon substrate. The substrate 8 can further comprise a semiconductor material layer 9, which can be provided by forming a doped well over the substrate semiconductor layer 4. The conductivity type of the semiconductor material layer 9 may be the same as, or may be different from, the conductivity type of the substrate semiconductor layer 4. The semiconductor material layer 9 may be a single crystalline semiconductor material layer. In one embodiment, the semiconductor material layer 9 can be a single crystalline silicon layer. If p-doped or n-doped, the semiconductor material layer 9 can have a dopant concentration in a range from $1.0 \times 10^{14}/cm^3$ to $1.0 \times 10^{18}/cm^3$, although lesser and greater dopant concentrations can also be employed.

Shallow trench isolation structures 720 can be formed in an upper portion of the semiconductor material layer 9 to provide electrical isolation among the semiconductor devices. The semiconductor devices 710 can include, for example, field effect transistors including respective transistor active regions 742 (i.e., source regions and drain regions), channel regions 746 and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which can include a dielectric liner 761 such as a silicon nitride liner that blocks diffusion of mobile ions and/or apply appropriate stress to underlying structures, interconnect-level dielectric layers 760 formed at various interconnect levels that overlie the dielectric liner 761, a passivation dielectric layer (e.g., hydrogen diffusion barrier) 768 that overlies the interconnect-level dielectric layers 760. The interconnect-level dielectric layers 760 functions as a matrix for metal interconnect structures 780 that provide electrical wiring among the various nodes of the semiconductor devices and landing pads for through-stack contact via structures to be subsequently formed. The metal interconnect structures 780 can include, for example, contact via structures 781, first metal lines 782, first via structures 783, second metal lines 784, second via structures 785, and topmost metal lines 786. Additional metal lines (not shown) and additional via structures (not shown) can be formed between the second via structures 785 and the topmost metal lines 786. The interconnect-level dielectric layers 760 can include multiple interconnect-level dielectric layers (762, 764, 766) that embed a respective subset of the metal interconnect structures 780. For example, the interconnect-level dielectric layers 760 can include a first-interconnect-level dielectric layer 762, a second-interconnect-level dielectric layer 764, and a topmost-interconnect-level dielectric layer 766. Additional interconnect-level dielectric layers (not shown) may be provided between the second interconnect-level dielectric layer 764 and the topmost interconnect-level dielectric layer 766. The passivation dielectric layer 768 can include a silicon nitride layer, and can block diffusion of hydrogen, moisture, and impurities from outside the semiconductor chip 900 into the various interconnect-level dielectric layers 760 and the semiconductor devices 710. The thickness of the passivation dielectric layer 768 can be in a range from 10 nm to 300 nm, although lesser and greater thicknesses may also be employed.

Bonding pads (96, 92) can be formed over the passivation dielectric layer 768. Each of the bonding pads (96, 92) can be electrically shorted to a respective one of the topmost metal line 786 by direct contact, or through an intervening via structure (not illustrated) contacting a top surface of a respective topmost metal line 786 and a bottom surface of a bonding pad (96. 92).

Generally, a semiconductor device 710 is located on a semiconductor substrate 8, and interconnect-level dielectric layers 760 are formed over the semiconductor device 710. A first electrode 110, a field-induced switching component 120 (which may be any of the field-induced switching components 120 described above), and a second electrode 130 are formed within, or over, the interconnect-level dielectric layers 760. The field-induced switching component 120 exhibits formation of an electrical-field-induced temporary electrically conductive path upon application of an electrical field thereacross above a critical electrical field strength. The first electrode 110 is electrically shorted to a node (e.g., gate electrode, source or drain) of the semiconductor device 710, the field induced switching component 120 has a first surface that contacts the first electrode 110, and the second electrode 130 contacts a second surface of the field induced switching component 120, and is electrically shorted to electrical ground of the semiconductor device 710, which can be for example, the substrate semiconductor layer 4 and/or a ground pin of a package substrate into which the semiconductor chip 900 is subsequently mounted.

Figure 5:
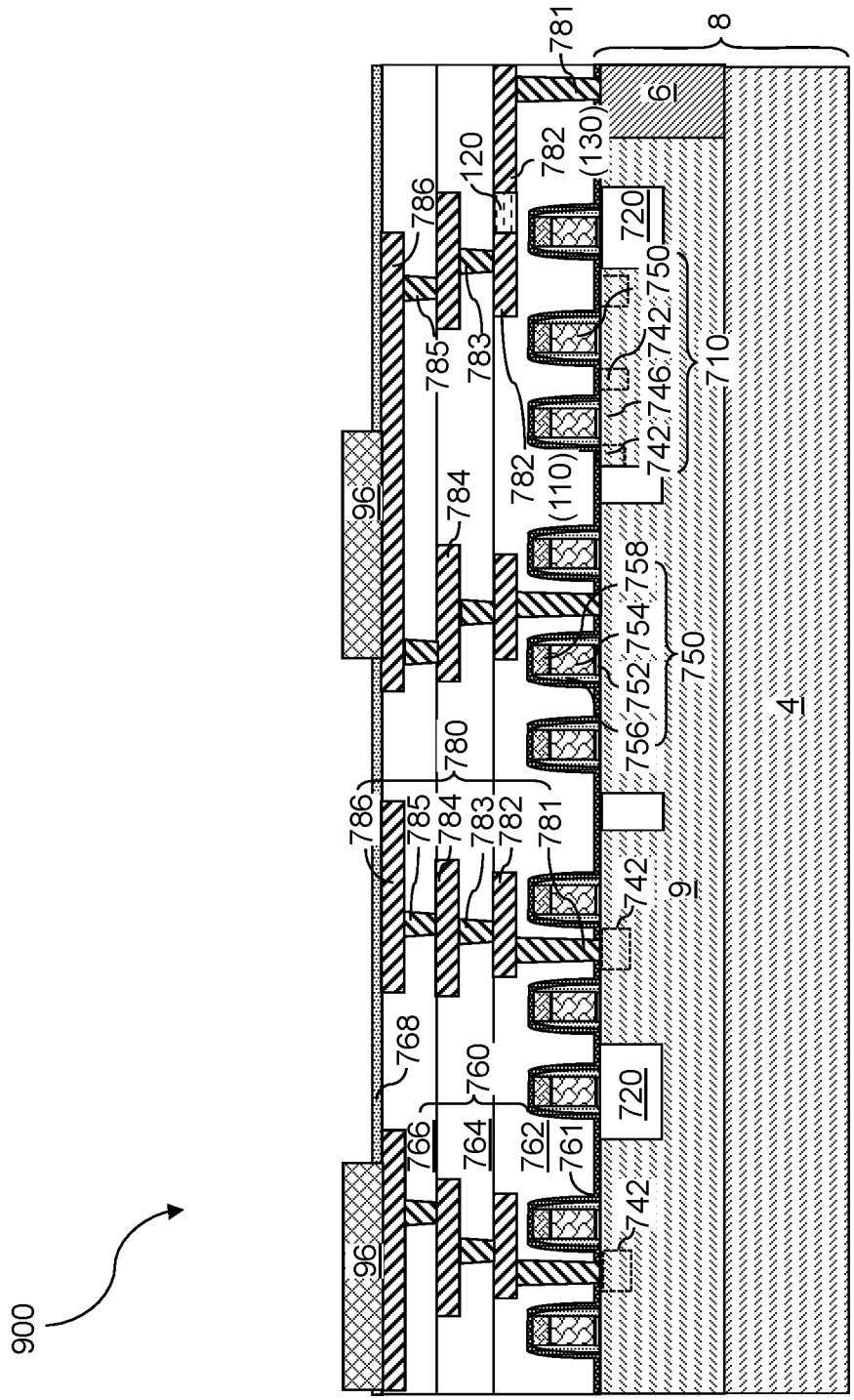
FIG. 5 is a vertical cross-sectional view of a first exemplary semiconductor structure incorporating an electrostatic discharge device of the embodiments of the present disclosure.

Referring to FIG. 5, the first electrode 110 and the second electrode 130 can be embedded within the interconnect-level dielectric layers 760, and the first surface and the second surface can comprise a respective vertical or tapered surface of the field-induced switching component 120. The first electrode 110 and the second electrode 130 can be metal lines (782, 784, 786) located at a same metal line level. For example, the first electrode 110 and the second electrode 130 can include a pair of first metal lines 782, a pair of second metal lines 784, a pair of topmost metal lines 786, or a pair of metal lines located at any intervening metal line level (not shown) between the second metal lines 784 and the topmost metal lines 786. In one embodiment, the substrate semiconductor layer 4 may function as electrical ground. In this case, a heavily doped (i.e., conductive) semiconductor region 6 having a doping of the same conductivity type as the substrate semiconductor layer 4 may be formed as part of the electrically conductive path to electrical ground.

Figure 6:
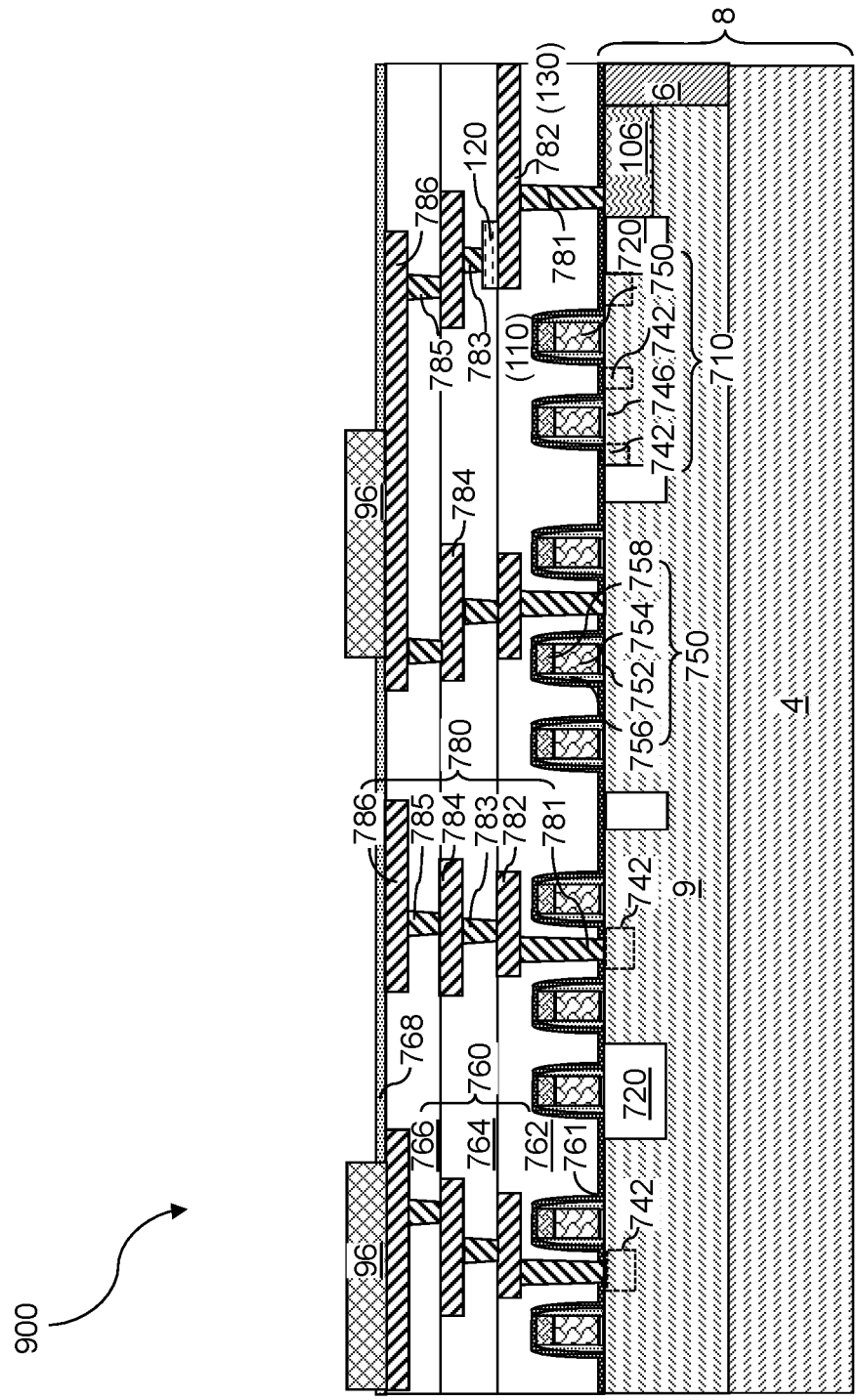
FIG. 6 is a vertical cross-sectional view of a second exemplary semiconductor structure incorporating an electrostatic discharge device of the embodiments of the present disclosure.

Referring to FIG. 6, the first electrode 110 and the second electrode 130 can be embedded within the interconnect-level dielectric layers 760, and the first surface can comprise a first horizontal surface of the field-induced switching component 120, and the second surface can comprise a second horizontal surface of the field-induced switching component 120 that is vertically offset from the first horizontal surface. For example, one of the first electrode 110 and the second electrode 130 can be a metal line (782, 784, or 786) located at a metal line level, and the other of the first electrode 110 and the second electrode 130 can be a metal via structure (781, 783, or 785) located at an overlying or underlying via level. The field-induced switching component 120 may have a greater area than the metal via structure (781, 783, or 785), or may have a same area as the metal via structure (781, 783, or 785) by occupying a volume of a via cavity in which the metal via structure (781, 783, or 785) is formed. In one embodiment, the field-induced switching component 120 may be formed as a liner structure located within a same line trench as a metal line (782, 784, or 786) or as a liner structure located within a same via cavity as the metal via structure (781, 783, or 785).

Figure 7:
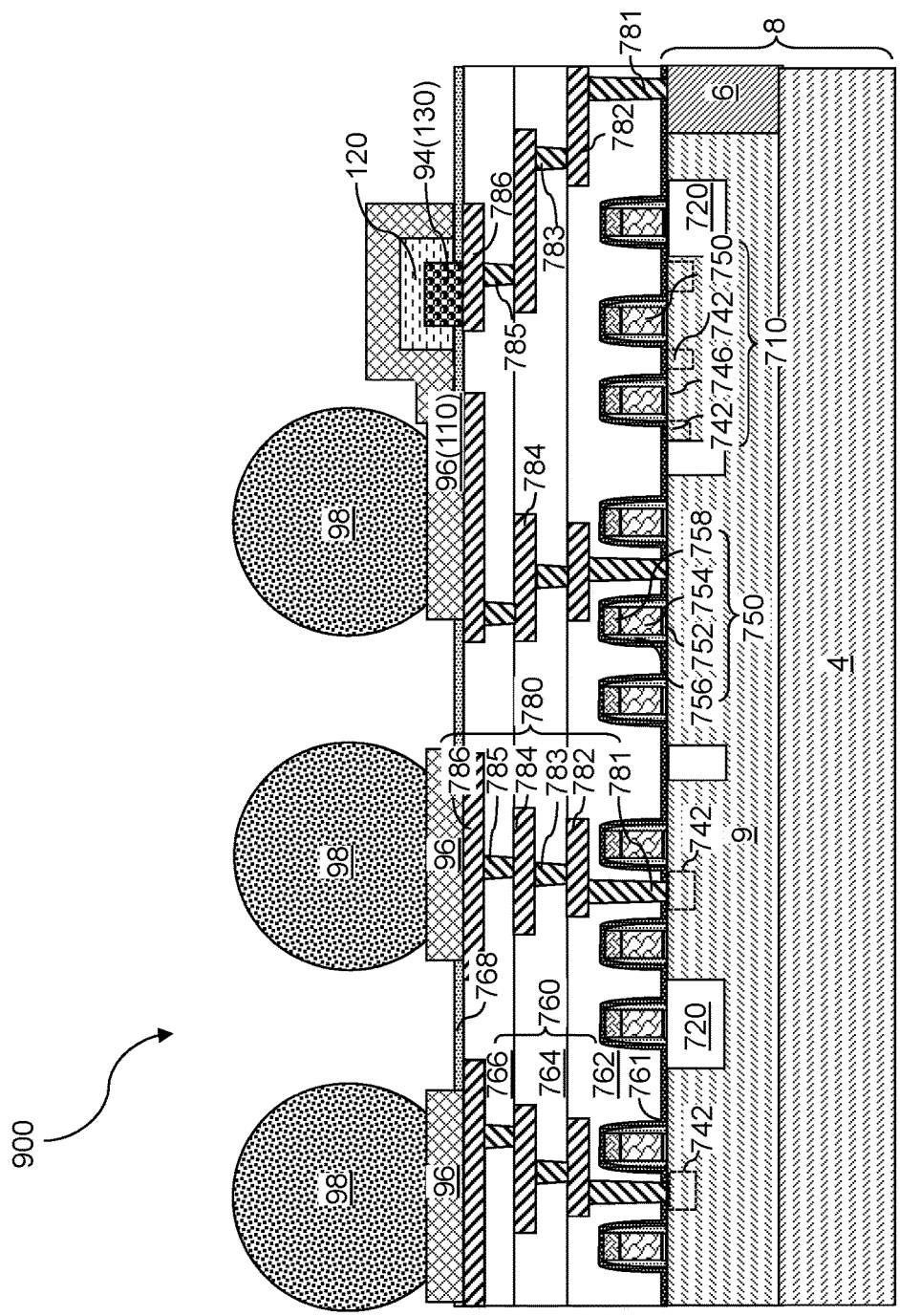
FIG. 7 is a vertical cross-sectional view of a third exemplary semiconductor structure incorporating an electrostatic discharge device of the embodiments of the present disclosure.
Figure 8:
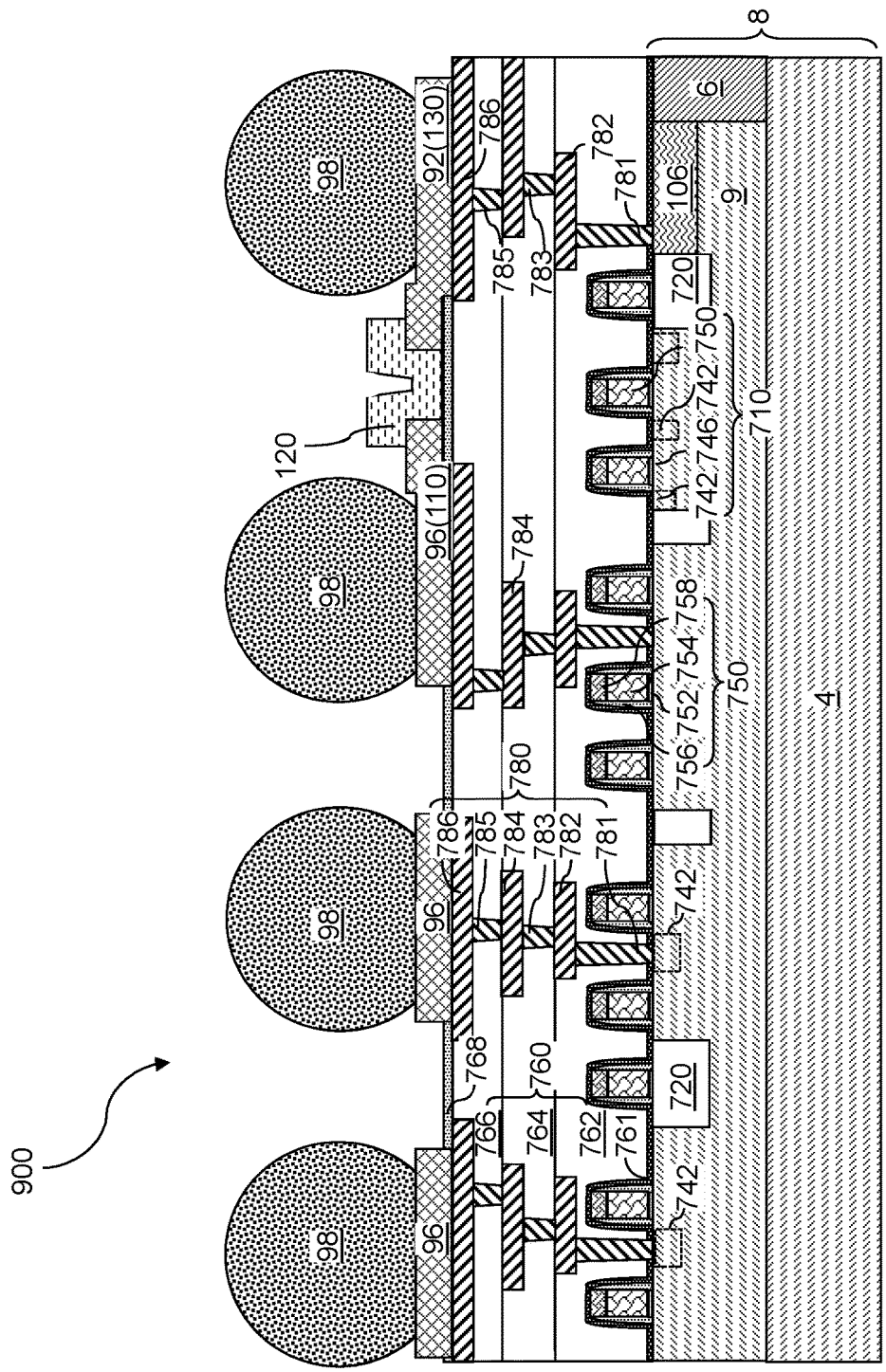
FIG. 8 is a vertical cross-sectional view of a fourth exemplary semiconductor structure incorporating an electrostatic discharge device of the embodiments of the present disclosure.
Figure 9:
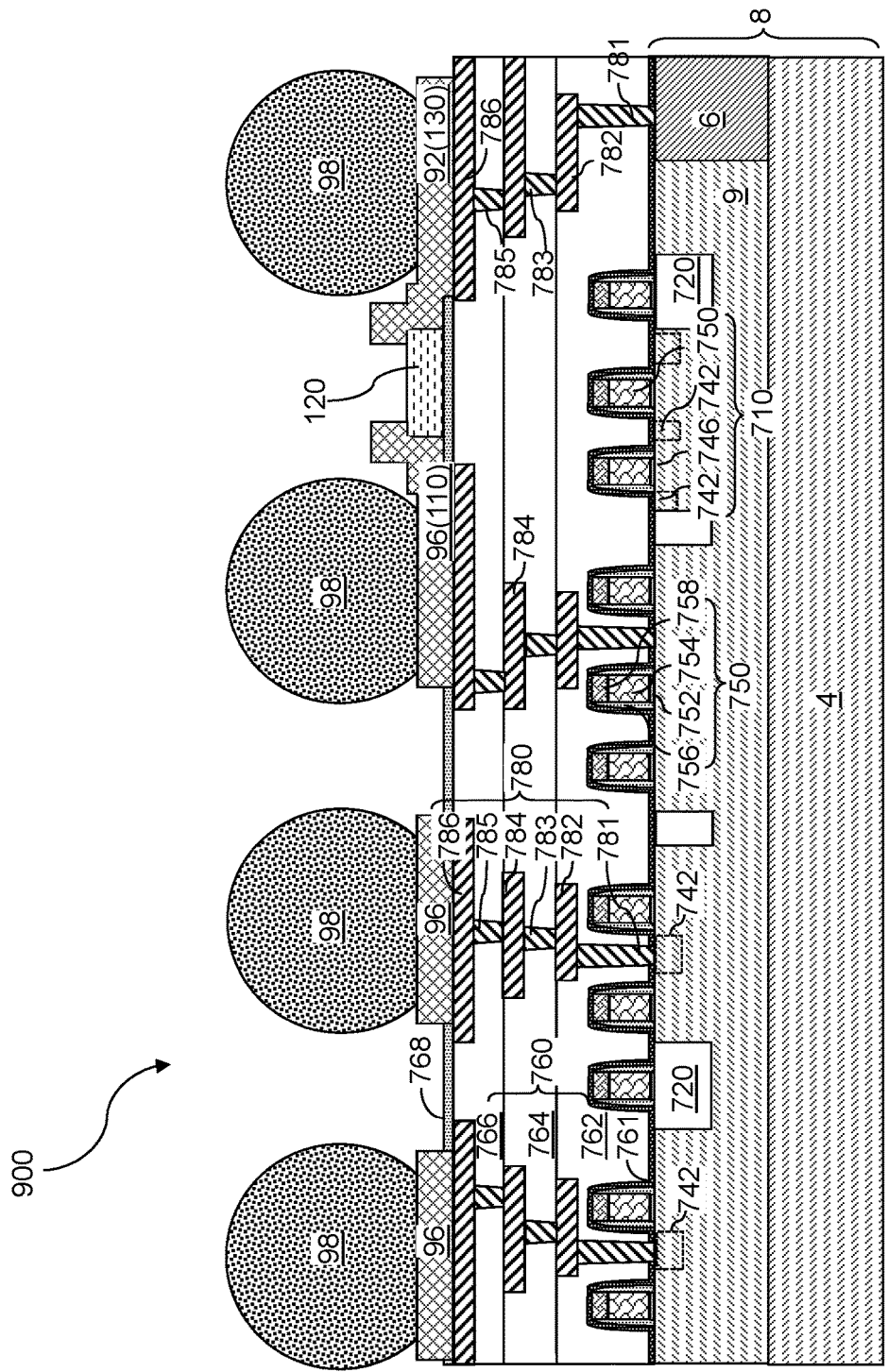
FIG. 9 is a vertical cross-sectional view of a fifth exemplary semiconductor structure incorporating an electrostatic discharge device of the embodiments of the present disclosure.

Referring to FIGS. 7-9, the first electrode 110 and the second electrode 130 can overlie the interconnect-level dielectric material layers 760. For example, a passivation dielectric layer 768 that blocks hydrogen diffusion can be disposed between the interconnect-level dielectric material layers 760 and each of the first and second electrodes (110, 130).

In one embodiment illustrated in FIG. 7, one of the first electrode 110 and the second electrode 130 can comprise a portion of a bonding pad 96 overlying the interconnect-level dielectric material layers 760, and another of the first electrode 110 and the second electrode 130 can comprise a metal portion 94. The field-induced switching component 120 can contact a horizontal surface of the first electrode 110, and the metal portion 94 can overlie, or underlie, the field-induced switching component 120. In this case, a portion, or an extension, of the bonding pad 96 can overlie, or underlie, the metal portion 94 with the field-induced switching component 120 therebetween. In one embodiment, the metal portion 94 extends through the passivation dielectric layer 768, and contacts a metal interconnect structure 780 (such as a topmost metal line 786) embedded within the interconnect-level dielectric material layers 760 as illustrated in FIG. 7. Solder balls 98 can be subsequently bonded to the bonding pads (96, 92).

In another embodiment illustrated in FIGS. 8 and 9, the first electrode 110 comprises a portion of a first bonding pad 96 overlying the interconnect-level dielectric material layers 760, and the second electrode 130 comprises a portion of a second bonding pad 92 overlying the interconnect-level dielectric material layers 760. In one embodiment, the first electrode 110 comprises a portion of a first bonding pad 96 that is located on a first peripheral region of a bottom surface of the field-induced switching component 120, and the second electrode 130 comprises a portion of a second bonding pad 92 that is located on a second peripheral region of the bottom surface of the field-induced switching component 120 as illustrated in FIG. 8. In another embodiment, the first electrode 110 comprises a portion of a first bonding pad 96 that is formed on a first peripheral region of a top surface of the field-induced switching component 120, and the second electrode 130 comprises a portion of a second bonding pad 92 that is formed on a second peripheral region of the top surface of the field-induced switching component 120 as illustrated in FIG. 9.

In some embodiments, the first electrode 110 comprises a portion of a first bonding pad 96, the second electrode 130 comprises a portion of a second bonding pad 92, and the field-induced switching component 120 is formed directly on a peripheral region of the first bonding pad 110 and a peripheral region of the second bonding pad 130.

The exemplary structures of FIGS. 7-9 can be formed by depositing and patterning at least one material layer including the material(s) of the field-induced switching component 120 during packaging of the semiconductor chip 900. At least one material layer can include a metal-insulator transition material layer that can be subsequently patterned to form metal-insulator transition material portions 122, or a set of material layers for forming mobile ion bridge structures (222, 224, 226) of a volatile conductive bridge. One side of each patterned field-induced switching component can be electrically shorted to a first subset of metal wires (such as the metal interconnect structures 780) connected to circuit components of the semiconductor devices 710. Another side of each patterned field-induced switching component can be electrically shorted to a second subset of metal wires connected to electrical ground. In case an electrostatic discharge (ESD) event occurs in any of the first subset of metal wires or the circuit components of the semiconductor devices 710, the field-induced switching component 120 transitions into a conductive state and shunts an ESD current to electrical ground, thereby avoiding damage to the electronic components of the semiconductor devices 710. Once the ESD current event terminates, the field-induced switching component 120 transitions back from the conductive state to the insulating state.

Figure 10:
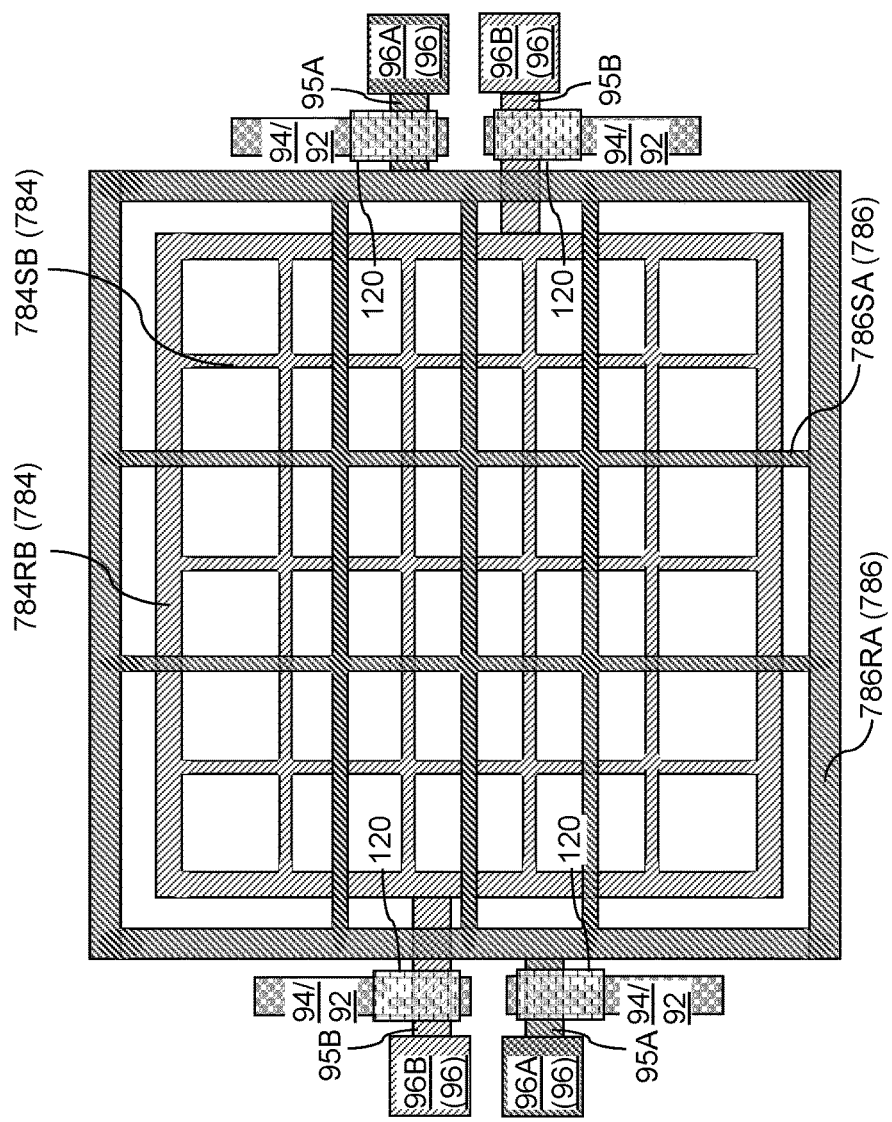
FIG. 10 is a plan view of metal interconnect structures that can be incorporated into any of the exemplary semiconductor structures of the embodiments of the present disclosure.

The metal interconnect structures 780 can include a power grid network and an electrical ground network. FIG. 10 illustrates a plan view of a subset of metal interconnect structures 780 that can be incorporated into any of the exemplary semiconductor structures of the embodiments of the present disclosure. The power grid network (786RA, 786SA, 784RB, 784SB) includes a source side (e.g., VSS) power grid network (786RA, 786SA) which includes a power supply ring structure 786RA located near a periphery of a semiconductor chip 900 and power supply stripes (or "power supply straps or rails") 786SA (e.g., the vertical lines are typically referred to as straps and horizontal lines are typically referred to as rails, which are collectively referred to as "stripes" herein). The power supply stripes 786SA include two sets of intersecting elongated metal lines adjoined to the power supply ring 786RA and forming an intersecting grid within the power supply ring 786RA. The various components of the source side power grid network (786RA, 786SA) may be a subset of topmost metal lines 786 or a subset of underlying metal lines (such as the second metal lines 784 or any metal lines located between the topmost metal lines 786 and the second metal lines 784). The power grid network (786RA, 786SA, 784RB, 784SB) also includes a drain side (e.g., VDD) power grid network (784RB, 784SB) including a power supply ring structure 786RB located near a periphery of a semiconductor chip 900 and drain side power supply stripes 786SB. The various components of the drain side power grid network (784RB, 784SB) may be a subset of metal interconnect structures 780 located at a different level than the level of the source side power grid network (786RA, 786SA).

The source side power grid network (786RA, 786SA) can be electrically shorted to at least one first power supply bonding pad 96A, which is at least one of the bonding pads 96. At least one power supply pad extension (e.g., trunk) 95A can provide electrical connection between the source side power grid network (786RA, 786SA) and a bonding region of each power supply bonding pad 96A. The drain side power grid network (784RB, 784SB) can be electrically shorted to at least one second power supply bonding pad 96B, which is at least another of the bonding pads 96. At least one second power supply pad extension (e.g., trunk) 95B can provide electrical connection between the drain side power grid network (784RB, 784SB) and a bonding region of each second power supply bonding pad 96B.

Generally, the power grid network (786RA, 786SA, 784RB, 784SB) includes a network of metal interconnect structures 780 embedded within the interconnect-level dielectric layers 760 and configured to distribute electrical power over a device area including an area of the semiconductor device 710. Electrical power can be distributed to various semiconductor devices 710 in the semiconductor chip 900 from the at least one respective power supply bonding pad (96A, 96B) and through the power grid network (786RA, 786SA, 784RB, 784SB). Electrostatic discharge (ESD) devices of the embodiments of the present disclosure can be formed over one or both of the power supply pad extensions (95A, 95B). In this case, the first electrode 110 is electrically shorted to the power grid network (786RA, 786SA, 784RB, 784SB) at one of the power supply pad extensions (e.g., trunks) (95A, 95B).

Figure 11:
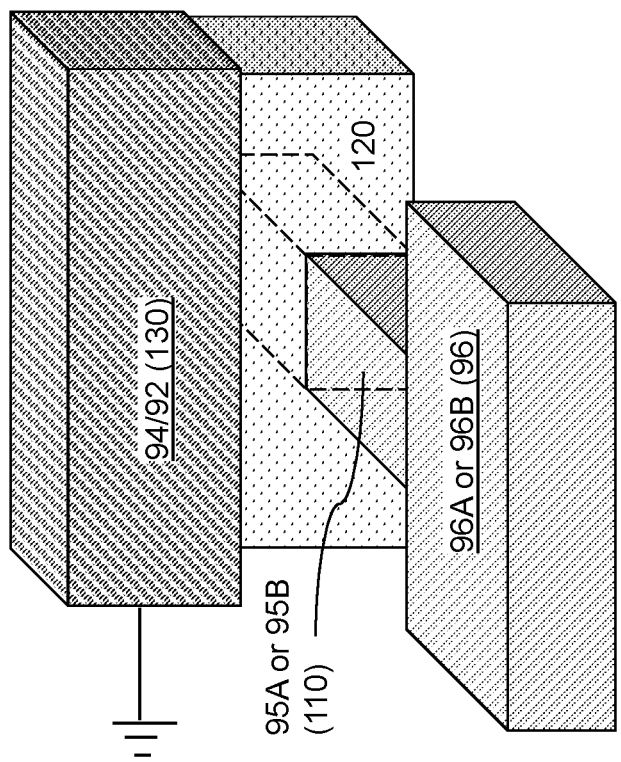
FIG. 11 is a perspective view of an exemplary configuration of an exemplary electrostatic discharge device of FIG. 10 according to an embodiment of the embodiments of the present disclosure.

Referring to FIG. 11, an exemplary ESD device that can be formed over a power supply pad extension (95A, 95B) is illustrated. A field-induced switching component 120 can straddle the power supply pad extension (95A, 95B). A metal portion 94 or an extension portion of another bonding pad 92 connected to electrical ground is formed over or under the field-induced switching component 120. The power supply pad extension (95A, 95B) functions as the first electrode 110, and the metal portion 94 or the extension portion of the other bonding pad 92 functions as the second electrode 130.

Figure 12:
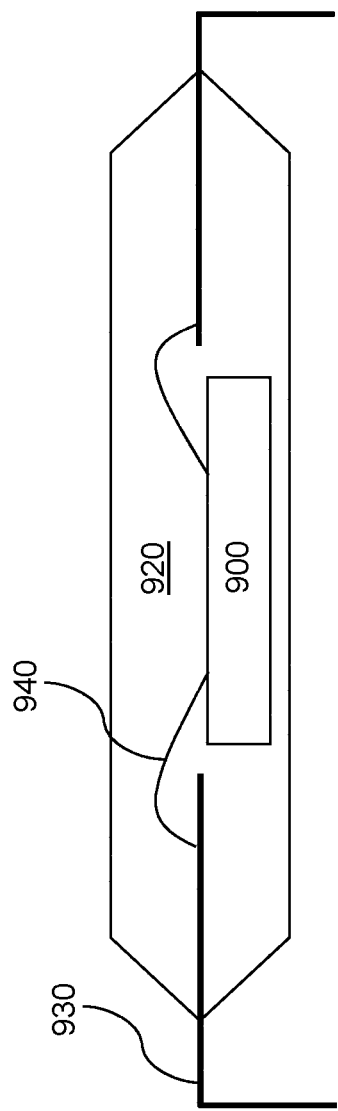
FIG. 12 is a vertical cross-sectional view of a chip package incorporating any of the exemplary semiconductor structures of the embodiments of the present disclosure.

The semiconductor chip 900 may be placed in a chip package as illustrated in FIG. 12. The chip package can include a dielectric mold or housing 920 that encapsulates or encloses the semiconductor chip 900 including the semiconductor substrate, the interconnect-level dielectric layers, and the first and second electrodes (110, 130), connection leads 930, and bonding wires 940 connecting each of the bonding pads (96A, 96B) to a respective one of the connection leads 930. The connection leads 930 can include a ground lead that is connected to electrical ground of a motherboard. The second electrode 130 of each ESD device of the embodiments of the present disclosure can be electrically shorted to a ground lead of the chip package.

Referring back to FIGS. 6 and 8, the electrical current that can pass through the ESD devices of the embodiments of the present disclosure may be limited by introducing a resistor 106 in the path of the electrical discharge path. For example, a resistor 106 can be formed in the path of the electrical current from an ESD device of the embodiments of the present disclosure to electrical ground such as the substrate semiconductor layer 4. The resistor 106 may be any type of resistor known in the art. In one embodiment, the resistor 106 may be a polysilicon resistor having electrical resistivity in a range of a semiconducting material, i.e., having electrical conductivity in the range from $1.0 \times 10^{-6}$ S/cm to $1.0 \times 10^{5}$ S/cm.

Addition of a resistor 106 in the ESD circuitry can be beneficial especially for some metal-insulator transition materials that may fail if the surge current density exceeds a maximum value for the metal-insulator transition material. By including an integrated resistor in series with the metal-insulator transition material, the electrical current that can pass through each ESD device can be limited, and the ESD device can be used repeatedly.

In order to ensure that the system can handle a large current surge, multiple instances of the ESD device can be electrically connected in parallel to the semiconductor circuitry under protection. The number of ESD devices depends on the expected current surges in the system and the amount of current each instance of the ESD device can support. The addition of resistors 106 to the ESD devices connected in parallel can add additional flexibility in terms of design and can improve the overall robustness of the system.

The various ESD devices of the embodiments of the present disclosure employ a direct change in an intrinsic material state (such as changes between an insulating state to a conductive state) to prevent electrostatic discharge damage to semiconductor devices. The ESD devices of the embodiments of the present disclosure can be easily incorporated into a metal interconnect level or into the bonding pad level in a manufacturing process. Multiple ESD devices can be simultaneously formed to protect a semiconductor chip against various types of electrostatic discharge events.

The various ESD devices of the embodiments of the present disclosure provide fast response time. The transition from an insulating state to a conductive state is extremely fast, which allows the ESD circuitry to react quickly and prevent circuit damage. Since the volatile material rapidly reverts back to the insulating state once the applied field is removed, the ESD devices of the embodiments of the present disclosure can also handle multiple discharge events. In addition, the various ESD devices of the embodiments of the present disclosure provide robust switching characteristics. The field-induced switching components of the embodiments of the present disclosure display high cycling endurance, which demonstrates the durability of the field-induced switching components of the embodiments of the present disclosure.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

The invention claimed is:

1. A device structure, comprising:
   a semiconductor device located over a substrate;
   a first electrode located within, or over, interconnect-level dielectric layers that overlie the semiconductor device and electrically shorted to a node of the semiconductor device;
   a field-induced switching component exhibiting formation of a volatile electrical-field-induced temporary electrically conductive path upon application of an electrical field thereacross above a critical electrical field strength and having a first surface that contacts the first electrode; and
   a second electrode located within, or over, the interconnect-level dielectric layers, contacting a second surface of the field-induced switching component, and electrically connected to electrical ground;
   wherein:
   the device structure comprises a surge protection device;
   the field-induced switching component comprises a metal-insulator transition material portion which undergoes a transition from an electrically insulating state to an electrically conductive state upon application of a voltage above a threshold voltage across the metal-insulator transition material portion, and which undergoes a transition from the electrically conductive state to the electrically insulating state upon termination of the application of the voltage;
   the metal-insulator transition material portion comprises an Ovonic Threshold Switch chalcogenide material; and
   the metal-insulator transition material portion has a composition of $L_x M_{1-x}$, wherein L is selected from Si and Ge, M is selected from Se and Te, and x is in a range 0.25 to 0.75, wherein the composition is undoped or doped with a Group V element.

2. A device structure, comprising:
   a semiconductor device located over a substrate;
   a first electrode located within, or over, interconnect-level dielectric layers that overlie the semiconductor device and electrically shorted to a node of the semiconductor device;
   a field-induced switching component exhibiting formation of a volatile electrical-field-induced temporary electrically conductive path upon application of an electrical field thereacross above a critical electrical field strength and having a first surface that contacts the first electrode; and
   a second electrode located within, or over, the interconnect-level dielectric layers, contacting a second surface of the field-induced switching component, and electrically connected to electrical ground;
   wherein the field-induced switching component comprises a volatile conductive bridge containing a mobile ion bridge structure exhibiting formation of a temporary electrically conducive path upon application of the electrical field thereacross above the critical electrical field strength; and
   wherein the mobile ion bridge structure comprises:
   a first metal layer;

a dielectric metal oxide layer located on the first metal layer, wherein the first metal layer is composed of a first metal that provides mobile ions into the dielectric metal oxide layer upon application of an external electrical bias, and the dielectric metal oxide layer functions as a matrix for the mobile ions; and a second metal layer contacting the dielectric metal oxide layer and spaced from the first metal layer.

3. The device structure of claim 2, wherein:

one the first metal layer and the third metal layer comprises a silver layer;

the dielectric metal oxide layer comprises hafnium oxide; and another of the first metal layer and the third metal layer comprises a metal, metal alloy or a heavily doped semiconductor material.

4. A surge protection device, comprising:

a first electrode;

a second electrode electrically connected to electrical ground; and a field-induced switching component electrically contacting the first electrode and the second electrode, wherein the field-induced switching component comprises a volatile conductive bridge containing a mobile ion bridge structure which comprises:

a first metal layer;

a dielectric metal oxide layer located on the first metal layer, wherein the first metal layer is composed of a first metal that provides mobile ions into the dielectric metal oxide layer upon application of an external electrical bias, and the dielectric metal oxide layer functions as a matrix for the mobile ions; and a second metal layer contacting the dielectric metal oxide layer and spaced from the first metal layer.

\* \* \* \* \*